United States Patent [19]
Leung

[11] Patent Number: 5,030,855
[45] Date of Patent: Jul. 9, 1991

[54] CURRENT LOGIC TRANSCEIVER
[75] Inventor: Wingyu Leung, Cupertino, Calif.
[73] Assignee: Integrated Device Technology, Inc., Santa Clara, Calif.
[21] Appl. No.: 521,268
[22] Filed: May 8, 1990
[51] Int. Cl.$^5$ .............................................. H03K 5/09
[52] U.S. Cl. .................................. 307/475; 307/443; 307/451; 365/189.01
[58] Field of Search ............... 307/443, 451, 270, 496, 307/449; 365/189

[56] References Cited
U.S. PATENT DOCUMENTS

| 4,491,748 | 1/1985 | Chappell et al. | 307/449 |
| 4,859,877 | 8/1989 | Cooperman et al. | 307/443 |
| 4,890,010 | 12/1989 | Neudeck et al. | 307/270 |

Primary Examiner—David Hudspeth
Assistant Examiner—Scott A. Ovellette
Attorney, Agent, or Firm—Thomas E. Schatzel

[57] ABSTRACT

For cummunication across a capacitively loaded line (108) a line driver (104) and a receiver (106) are used. The line driver (104) includes at least one gate (switch) (122) and at least one current mirror (120), the combination for selectively developing a current of predetermined level at the receiver output (108). The receiver (106) includes a current source (transistor) (202) for developing a current of predetermined level at an output (220). In addition, the receiver (106) also includes another current mirror (200) for converting the current level on the line (108) to a voltage level at the output (220).

10 Claims, 1 Drawing Sheet

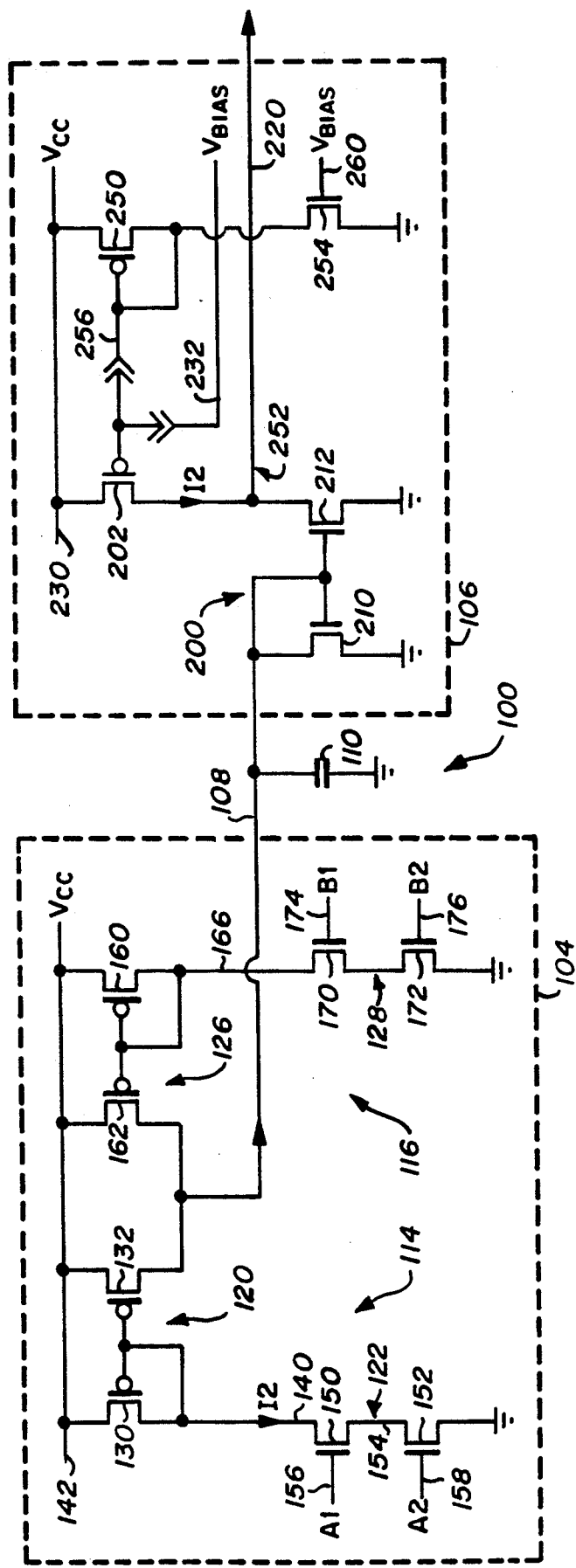
Fig_1

CURRENT LOGIC TRANSCEIVER

TECHNICAL FIELD

The present invention relates to CMOS-type digital integrated circuits generally and more particularly to a transceiver for a RAM address decoder for communication across a capacitively loaded (word) line.

BACKGROUND ART

Traditionally, complementary metal-oxide-semiconductor (CMOS) type digital integrated circuits represent binary states by means of voltage levels. Specifically, a binary state of "one" is represented by a voltage level of five volts with respect to a circuit ground potential level; and, a binary state of "zero" is represented by a voltage level of zero volts with respect to the circuit ground potential level. The use of such a system of representation is advantageous in that circuits in conformance therewith are relatively simple to implement, since no external reference is required. Further, such a system is advantageous in that circuits in conformance therewith need dissipate relatively little static power, since relatively little current is required except during changes of state. In addition, such a system is advantageous in that circuits in conformance therewith have a relatively high noise immunity when a binary threshold of two and one half volts with respect to the circuit ground potential level is employed. Unfortunately, such a system is disadvantageous in that the switching speed of circuits in conformance therewith is relatively slow when the circuits are loaded by a relatively high capacitance. This is because the propagation delay of such a circuit is directly proportional to the magnitude of the voltage swing and the loading capacitance. Further, such a system is disadvantageous in that in a random-access-memory (RAM) decoder (binary-to-thermometer-code converter), such a system requires a relatively large number of transistors and, thus, is relatively slow.

DISCLOSURE OF THE INVENTION

It is therefore the primary object of the present invention to provide a transceiver for high speed communication across a capacitively loaded line.

Another object of the present invention is to provide a high speed communication system which is flexible.

Yet another object of the present invention is to provide a high speed communication system which is complementary with traditional CMOS systems.

Yet another object of the present invention is to provide a high speed communication system for use in a RAM decoder which requires a relatively small number of transistors and which is relatively fast.

Briefly, for communication across a capacitively loaded line (108), a transceiver (100) in accordance with the present invention comprises a line driver (104) and a receiver (106). The line driver (104) includes at least one gate (switch) (122) and at least one current mirror (120), the combination for selectively developing a current of predetermined level at the receiver output (108). The receiver (106) includes a current source (202) for developing a current of predetermined level at an output (220). In addition, the receiver (106) also includes another current mirror (200) for converting the current level on the line (108) to a voltage level at the output (220).

These and other objects of the present invention will no doubt become apparent to those skilled in the art after having read the detailed description of the presently preferred embodiment of the present invention which is illustrated in the figure of the drawing.

BRIEF DESCRIPTION OF THE FIGURE IN THE DRAWING

FIG. 1 is a schematic diagram of a high speed transceiver in accordance with the present invention.

BEST MODE FOR CARRYING OUT THE INVENTION

Illustrated in FIG. 1 of the drawing generally designated by the number 100 is the presently preferred embodiment of a high speed transceiver in accordance with the present invention. Transceiver 100 comprises a line driver (transmitter), which is designated in the FIG. 104, a line receiver, which is designated 106, and a capacitively loaded line, which is designated 108. For purposes of illustration, in the figure, the capacitive loading of line 108 is represented by a discrete capacitor, designated 110. Line 108 is configure to couple the output of line driver 104 to the input of line receiver 106.

In the presently preferred embodiment, line driver 104 has two, similar, portions, which are respectively designated 114 and 116 and which are connected in a wired OR configuration. Each of the portions employs a current mirror and a gate (switch), portion 114 employing a current mirror 120 and a gate 122 and portion 116 employing a current mirror 126 and a gate 128.

Preferably, current mirror 120 includes a pair of similar, P-channel, transistors, which are respectively designated 130 and 132. Transistor 130 is configured as a diode with the transistor gate connected to a line 140 and with the transistor channel connected between a line 142 and line 140. (In other words, the transistor 130 channel is configured with the end of the channel commonly referred to as the transistor source connected to line 142 and with the end of the channel commonly referred to as the transistor drain connected to line 140.) Line 142 is connected to receive a power supply potential (Vcc). Transistor 132 is configured with the transistor gate connected to line 140 and with the transistor channel connected between lines 142 and 108. In this configuration, current mirror 120 develops a current (representing the flow of charge) in line 108 the level of which is proportional to the level of the current (represented by the flow of charge) in line 140. Preferably, transistors 130 and 132 are similar; and, thus, the current levels are similar.

Gate 122 includes a pair of N-channel transistors, respectively designated 150 and 152. Transistors 150 and 152 are configured in, preferably, a NAND gate configuration to gate the level of the current in 140. More specifically, the channels of transistors 150 and 152 are connected in series between line 140 and a circuit ground potential (Vss). (In other words, the channel of transistor 150 is connected between line 140 and a line 154; and, the channel of transistor 152 is connected between line 154 and a circuit ground potential.) The gate of transistor 150 is connected to a line 156 to receive an externally developed signal, the traditional (five volt and zero volt), voltage level, binary state of which is referred to herein as A1. The gate of transistor 152 is connected to a line 158 to receive another, externally developed signal, the traditional, voltage level, binary state of which is referred to herein as A2.

Current mirror 126, which is similar to current mirror 120, also, includes a pair of, preferably, similar, P-channel transistors, respectively designated 160 and 162. Transistor 160 is configured as a diode with the transistor gate connected to a line 166 an with the transistor channel connected between line 142 and line 166. Transistor 162 is configured with the transistor gate connected to line 166 and with the transistor channel connected between lines 142 and line 108. In this configuration, current mirror 126, also, develops a current in line 108 the level of which is proportional to the level of the current in line 166.

Gate 128, which is similar to current gate 122, also includes a pair of N-channel transistors, respectively designated 170 and 172. Transistors 170 and 172 are, also, preferably, configured in a NAND gate configuration to gate the level of current in line 166. Specifically, the channels of transistors 170 and 172 are connected in series between line 166 and a circuit ground potential (Vss). The gate of transistor 170 is connected to a line 174 to receive an externally developed signal, the traditional, voltage level, binary state of which is referred to herein as B1. The gate of transistor 172 is connected to a line 176 to receive another, externally developed signal, the traditional, voltage level, binary state of which is referred to herein as B2.

In the presently preferred embodiment, current mirrors 120 and 126 each, selectively, develop a current (representing the flow of charge) in line 108 the level of which is either a predetermined level, referred to herein as I1, or zero. In one embodiment, a current level of zero is used to represent the logical state of:

$$(\overline{A1.A2+B1.B2}).$$

In another embodiment, of similar structure, a current level of I1 is used to represent the logical state of:

$$(A1.A2.(\overline{B1.B2})+B1.B2.(\overline{A1.A2})).$$

In yet another embodiment, of similar structure, a current level of twice I1 is used to represent the logical state of:

$$(\overline{A1.A2.B1.B2}).$$

In the presently preferred embodiment, line receiver 106 employs current mirror 200 and a current source (transistor) 202.

Preferably, current mirror 200 includes a pair of similar, N-channel, transistors, which are respectively designated 210 and 212. Transistor 210 is configured as a diode with the transistor gate connected to line 108 and with the transistor channel connected between line 108 and a circuit ground potential. Transistor 212 is configured with the transistor gate connected to line 108 and with the transistor channel connected between a line 220 and a circuit ground potential. In this configuration, current mirror 200 develops a current (representing the flow of charge) in line 220 the level of which is proportional to the level of the current (represented by the flow of charge) in line 108. Preferably, transistors 210 and 212 are similar; and, thus, the current levels are similar.

Transistor 202 is configured with the transistor channel connected between line 220 and a line 230, which is connected to receive a power supply potential (Vcc). In the presently preferred embodiment, the base of transistor 202 is connected to a line 232 to receive a reference potential developed thereon. In this configuration, transistor 202 develops a current (representing the flow of charge) of predetermined level in line 220.

For high speed communication across a capacitively loaded line (line 108), the diode configuration of transistor 210 minimizes the voltage swing developed on line 108. Transistor 202 functions as a current source to develop in line 220 a current of predetermined level, referred to herein as I2. This current (I2) is used to establish on line 220 a voltage, the level of which reflects the logical state of the current in line 108.

In one embodiment, the level of I2 is defined as one half the non-zero level of I1. As a consequence, the level of the voltage developed on line 220 represents the logical state of:

$$(A1.A2+B1.B2).$$

In another embodiment, of similar structure, the non-zero level of I2 is defined as one and one half the level of I1. As a consequence, the level of the voltage developed on line 220 represents the logical state of:

$$(A1.A2.B1.B2).$$

In another embodiment, transistor 202 is configured with a transistor 250 as a current mirror 252; and, another transistor, 254, is configured as a current sink. Transistor 250 is configured with the transistor gate connected to the base of transistor 202 by a line 256 and with the transistor (250) channel connected between lines 230 and 256. In this configuration, current mirror 252 develops a current in line 220 the level of which is proportional to the level of a current in line 256. Preferably, transistors 202 and 250 are similar, P-channel-type transistors; and, preferably, current mirror 252 is similar to current mirror 120.

Transistor 254 is configured with the transistor channel connected between line 256 and a circuit ground potential and with the transistor gate connected to a line 260 to receive a reference potential developed thereon. In this configuration, transistor 254 sinks a current (representing the flow of charge) of predetermined level from line 256.

In the presently preferred embodiment, transceiver 100 forms a portion of an address decoder (binary-to-thermometer-code converter) of a random-access-memory (RAM) integrated circuit (IC). Therein, line 108 functions as a current-level equivalent of the word line; and, line 220 functions as a local (voltage level) word line.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. A transceiver comprising in combination:
a capacitively loaded line (108);
a line driver (104) employing first switching means (122) and first current mirror means (120) connected to said line (108) and connected to said line driver (104) first switching means (122), said line driver (104) first current mirror means (120) for selectively developing on said line (108) a current of predetermined level; and a receiver (106) employing current source means (202) and first current mirror means (200) connected to said line (108) and connected to said receiver (106) current source means (202), said receiver (106) first current mirror means (200) for developing a voltage the level of which represents the level of the current selectively developed on said line (108).

2. A transceiver as recited in claim 1 wherein said line driver (104) first current mirror means (120) includes,
   a first transistor (130) having a gate connected to said line driver (104) first switching means (122) and a channel connected between a power supply potential and said line driver (104) first switching means (122), and
   a second transistor (132) having a gate connected to said line driver (104) first switching means (122) and a channel connected between the power supply potential and said line (108).

3. A transceiver as recited in claim 2 wherein said line driver (104) first switching means (122) includes,
   a first transistor (150) having a gate and a channel, and
   a second transistor (152) having a gate and a channel connected in series with said line driver (104) first switching means (122) first transistor (150) channel between said line driver (104) first current mirror means (120) and a circuit ground potential.

4. A transceiver as recited in claim 1 wherein said line driver (104) further employs second switching means (128) and second current mirror means (126) connected to said line (108) and connected to said line driver (104) second switching means (128), said line driver (104) second current mirror means (126) for selectively developing on said line (108) another current of predetermined level.

5. A transceiver as recited in claim 1 wherein said receiver (106) first current mirror means (200) includes,
   a first transistor (210) having a gate connected to said line (108) and a channel connected between said line (108) and a circuit ground potential, and
   a second transistor (212) having a gate connected to said line (108) and a channel connected between said receiver (106) current source means (202) and the circuit ground potential.

6. A transceiver as recited in claim 1 wherein said receiver (106) current source means (202) has
   a transistor (202) having a gate and a channel connected between a power supply potential and said receiver (106) first current mirror means (200) second transistor (212) channel.

7. A transceiver as recited in claim 1 wherein said receiver (106) current source means (202) has current sink means (254) and second receiver (106) current mirror means (202 and 250) connected to said receiver (106) first current mirror means (200) and to said receiver (106) current sink means (254).

8. A transceiver as recited in claim 7 wherein said receiver (106) first current mirror means (200) includes,
   a first transistor (210) having a gate connected to said line (108) and a channel connected between said line (108) and a circuit ground potential, and
   a second transistor (212) having a gate connected to said line (108) and a channel connected between receiver (106) current source means (202) and the circuit ground potential.

9. A transceiver as recited in claim 8 wherein said line driver (104) first current mirror means (120) includes,
   a first transistor (130) having a gate connected to said line driver (104) first switching means (122) and a channel connected between a power supply potential and said line driver (104) first switching means (122), and
   a second transistor (132) having a gate connected to said line driver (104) first switching means (122) and a channel connected between the power supply potential and said line (108).

10. A random-access-memory address decoder comprising in combination:
    a capacitively loaded line (108);
    a line driver (104) employing,
       first switching means (122) including,
           a first transistor (150) having a gate and a channel including a first and a second end, and
           a second transistor (152) having a gate and a channel connected between said line driver (104) first switching means (122) first transistor (150) channel first end and a circuit ground potential,
       first current mirror means (120) for selectively developing on said line (108) a current of predetermined level, said line driver (104) first current mirror means (120) including,
           a first transistor (130) having a gate connected to said line driver (104) first switching means (122) first transistor (150) channel second end and a channel connected between a power supply potential and said line driver (104) first switching means (122) first transistor (150) channel second end, and
           a second transistor (132) having a gate connected to said line driver (104) first switching means (122) first transistor (150) channel second end and a channel connected between the power supply potential and said line (108), second switching means (128) including,
           a first transistor (170) having a gate and a channel including a first and a second end, and
           a second transistor (172) having a gate and a channel connected between said line driver (104) second switching means (128) first transistor (170) channel first end and the circuit ground potential,
       second current mirror means (126) for selectively developing on said line (108) a current of predetermined level, said line driver (104) second current mirror means (126) including,
           a first transistor (160) having a gate connected to said line driver (104) second switching means (128) first transistor (170) channel second end and a channel connected between the power supply potential and said line driver (104) second switching means (128) first transistor (170) channel second end, and
           a second transistor (162) having a gate connected to said line driver (104) second switching means (128) first transistor (170) channel second end and a channel connected between the power supply potential and said line (108); and
    a receiver (106) employing current source means (202) and first current mirror means (200) connected to said line (108) and connected to said receiver (106) current source means (202), said receiver (106) first current mirror means (200) for developing a voltage the level of which represents the level of the current selectively developed on said line (108), said receiver (106) first current mirror means (200) including, a first transistor (210) having a gate connected to said line (108) and a channel connected between said line (108) and the circuit ground potential, and a second transistor (212) having a gate connected to said line (108) and a channel connected between said receiver (106) current source means (202) and the circuit ground potential.

* * * * *